(12) United States Patent
Stultz et al.

(10) Patent No.: US 8,279,568 B2
(45) Date of Patent: Oct. 2, 2012

(54) CHARGE PUMP SWITCH POWER DOWN PROTECTION

(75) Inventors: Julie Lynn Stultz, Scarborough, ME (US); Nickole Gagne, Saco, ME (US); Steven Macaluso, Scarborough, ME (US)

(73) Assignee: Fairchild Semiconductor Corporation, San Jose, CA (US)

( * ) Notice: Subject to any disclaimer, the term of this patent is extended or adjusted under 35 U.S.C. 154(b) by 356 days.

(21) Appl. No.: 12/760,286

(22) Filed: Apr. 14, 2010

(65) Prior Publication Data

US 2011/0255203 A1    Oct. 20, 2011

(51) Int. Cl.
*H02H 3/00* (2006.01)
*H02H 3/20* (2006.01)
*H02H 9/04* (2006.01)

(52) U.S. Cl. .......................................... 361/87; 361/91.1
(58) Field of Classification Search .................... 361/87, 361/91.1
See application file for complete search history.

(56) References Cited

U.S. PATENT DOCUMENTS

| 6,150,845 | A | 11/2000 | Morrill |
| 6,163,199 | A | 12/2000 | Miske et al. |
| 6,344,958 | B1 | 2/2002 | Morrill |
| 6,538,867 | B1 | 3/2003 | Goodell et al. |
| 6,731,486 | B2 | 5/2004 | Holt et al. |
| 6,774,675 | B1 | 8/2004 | Miske et al. |
| 7,049,767 | B2 * | 5/2006 | Wilhelm ........................ 315/291 |
| 2005/0285661 | A1 * | 12/2005 | Wittenbreder ................ 327/434 |

* cited by examiner

*Primary Examiner* — Dharti Patel
(74) *Attorney, Agent, or Firm* — Schwegman, Lundberg & Woessner, P.A.

(57) ABSTRACT

This application discusses, among other things, switch circuit apparatus having power down protection and not requiring power up sequencing. An apparatus embodiment can include a first supply node coupled to a first input of a level shifting circuit via a protection circuit, a second supply node coupled to a second input of the level shifting circuit via a single pull-up transistor, and a switch including a control input, a first node, and a second node controllably isolated from the first node, wherein the control input is coupled to the level shifting circuit. The first and second inputs of the level shifting circuit can be coupled via a rectifier, and the protection circuit can be configured to power the first and second supply nodes to controllably isolate the first and second nodes from each other when a voltage of one of the first or second nodes exceeds a threshold.

25 Claims, 6 Drawing Sheets

CHARGE PUMP SWITCH POWER DOWN PROTECTION

BACKGROUND

Developments in semiconductor technology have created the capability to produce low-cost, highly reliable switches that are, effectively, implementations of mechanical relays. They have been found to be of particular use, when implemented, as single pole, single throw, type relays, but are not limited thereto. Semiconductor switches are being used more and more as replacements for the prior mechanical relays, due to the high switching speed available as well as their ability to transfer relatively high currents without failure. These switches are often referred to as transfer gates or pass transistors as they employ the characteristics of transistors—usually MOS transistors—to either permit or prevent the passage of a signal.

Switches are widely used in many fields including large- and small-scale consumer products, such as, but not limited to, automobiles, home electronics and personal electronics (e.g. cell phones, personal digital assistants and personal media players, etc.). They can be used as analog routers, gates, or relays, or as digital multiplexers, routers, or gates.

OVERVIEW

This document discusses, among other things, apparatus and methods for a switch circuit. An apparatus can include a first supply node coupled to a first input of a level shifting circuit via a protection circuit and a second supply node coupled to a second input of the level shifting circuit via a single pull-up transistor. The apparatus can further include a switch including a control input, a first node, and a second node controllably isolated from the first node. The control input of the switch can be coupled to the level shifting circuit. The first and second supply nodes can be coupled using a voltage controlled switch such as a rectifier. The protection circuit can be configured to use a logic level of one of the first or second nodes to power the first and second supply nodes and to controllably isolate the first and second nodes from each other when a voltage of one of the first or second nodes exceed a threshold voltage.

This section is intended to provide an overview of subject matter of the present patent application. It is not intended to provide an exclusive or exhaustive explanation of the invention. The detailed description is included to provide further information about the present patent application.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various examples discussed in the present document.

DETAILED DESCRIPTION

Figure 1:
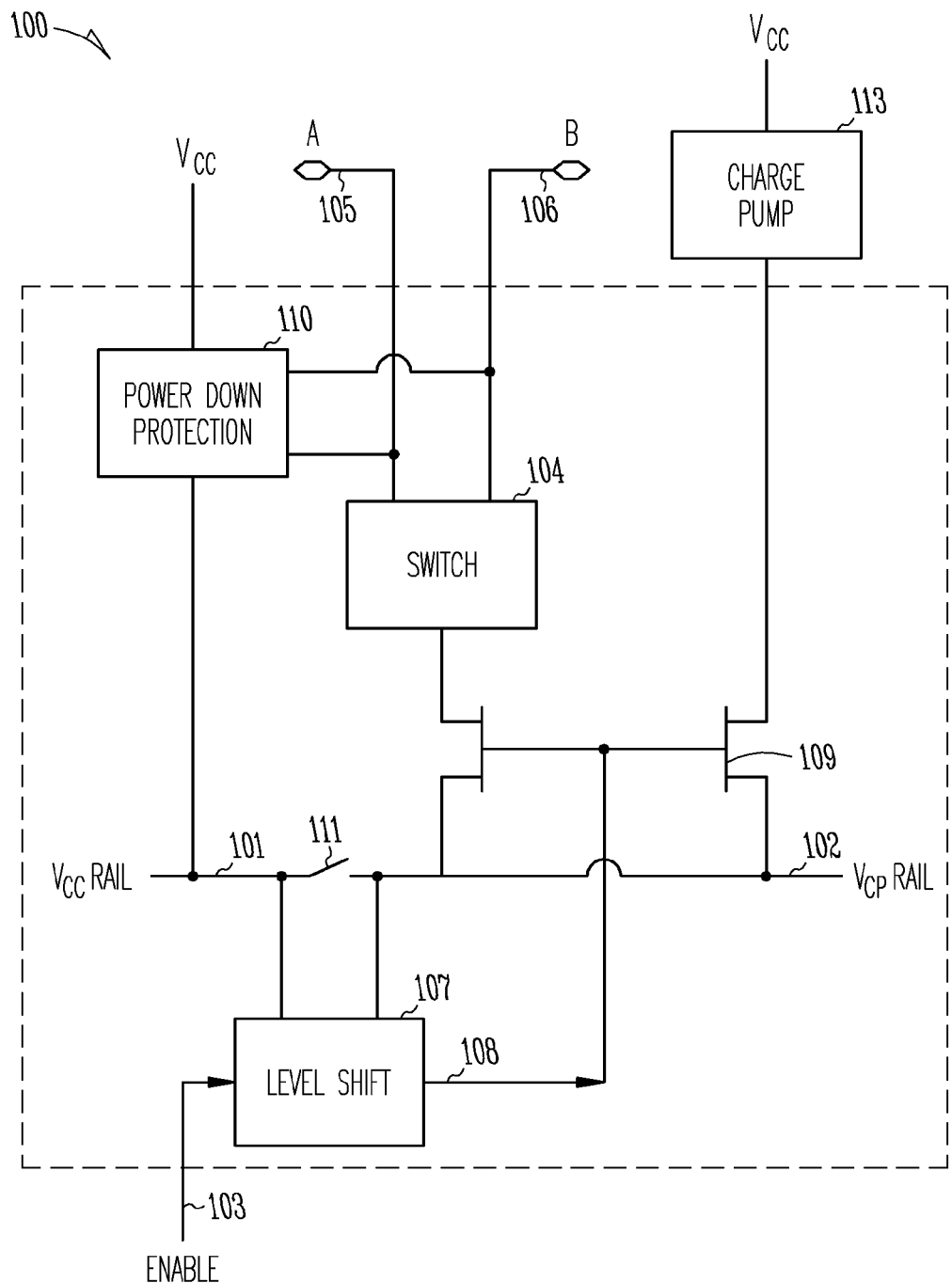
FIG. 1 shows a switch circuit according to one embodiment of the present subject matter.

As part of continuing developments in the field of semiconductor devices, particularly regarding size and operating speed, there has been a reduction in power required to operate such devices. Whereas standard operating systems utilize a 5-volt supply for proper operation of MOS and bipolar transistors, reductions of scale have yielded the capability to operate at lower supply levels including, but not limited to, 3-volt and 2-volt systems.

There are limitations, however, in the use of such devices. These limitations are related to fabrication vagaries, and, more significantly, they are related to inherent characteristics. In particular, there are threshold potential levels that must be overcome in order to activate semiconductor devices. These threshold activation levels are of importance, but not of insurmountable limitation, when the available supply is at least five volts, as is the case in most present systems. The threshold activation for externally-supplied transistors is typically about 0.8 volts. In a system having a high-potential power rail of 5 volts used to supply a logic high or "1" value, and a low-potential power rail of ground, or 0 volts used to supply a logic low or "0" value, for example, a drop in potential on the order of the threshold activation level noted will not cause a loss in system operation or function. The logic high and logic low signals can be transferred without distortion via an NMOS transistor as long as the signals fall within a range of values near the noted rail values.

A number of prior-art transfer gates have been developed for digital and analog applications. These devices for the most part perform adequately under steady state conditions. However, when a switch is powered down or disabled, voltages may still be present at the terminals of the switch that can cause leakage through the switch. The leakage can result from the control gate not being substantially coupled to allow the switch to fully isolate the switched nodes. Such leakage can drain the power supply of the device or other devices coupled to the switch circuit. Protection circuits have been developed to provide power down protection to reduce these leakage currents. However, these circuits introduce additional threshold voltages that must be overcome to allow the switch to accurately transfer logic signals. Upon power up, including power-up of the voltage supply sources, operation of the switch, before a voltage supply has reached a sufficient voltage level, can cause distortion of a transferred logic signal and can further destabilize a voltage supply such that recovery of the voltage supply to a preferred logic level can require momentary disabling, or power up sequencing, of the switch circuit.

The present subject matter provides a high-speed, low-power switch circuit that protects against leakage when the switch is disabled or otherwise in a power down state and also provides a stable switch supply voltage that does not require a sequenced power up of the circuit to accurately transfer logic signals.

FIG. 1 shows a switch circuit according to one embodiment of the present subject matter. The circuit 100 includes a first power rail 101, a second power rail 102, an enable input 103 and a switch 104 to controllably isolate and controllably transfer logic signals between a first node A 105 and a second node B 106. The circuit 100 includes a level shift circuit 107 to reduce the possibility of conducting "crow-bar" current as can happen when the enable input 103 is referenced to the first power rail 101 and the output 108 is referenced to the second power rail 102, and the second power rail voltage is more than a threshold voltage higher than the first power rail voltage. The output of the level shift circuit 107 controls the switch 104 by coupling and decoupling the control gate of the switch 104 to the second power rail 102 as well as coupling the second power rail 102 to the second supply source Vcp using a pull-up transistor 109. The second supply source, or second power supply, can include a charge pump 113 or other internal voltage that is usually higher than Vcc. Details of a level shift circuit are discussed in more detail below and with respect to FIG. 3. The circuit of FIG. 1 also includes a power down protection circuit 110. As discussed above, the power down protection circuit 110 reduces leakage current when the switch 104 is disabled or otherwise powered down and high voltages above a threshold are present at the switched nodes 105, 106 of the switch 104. In general, the power down protection circuit 110 raises the first power rail 101 to a high logic level, such as a voltage level present at one of the switch nodes 105, 106. The high logic level powers the circuit 100 and maintains isolation of the switch nodes 105, 106 by coupling the gate of the switch to a low logic level. Additional details of a power down protection circuit according to the present subject matter are discussed below with respect to FIG. 2. The circuit of FIG. 1 also includes a voltage controlled switch 111, such as a rectifier, coupling the first power rail 101 to the second power rail 102. The voltage controlled switch 111 works in conjunction with the power down protection circuit 110 to reduce leakage current by further powering the second power rail 102, thus, allowing the logic coupled to the gate of the switch 104 to pull the gate to a logic level that isolates nodes A 105 and B 106 from each other.

Additionally, at power up, the voltage controlled switch 111 provides adequate switch control voltage from the first power rail 101 to the second power rail 102. Providing adequate switch supply voltage to the second power rail 102 on power up reduces the need for power up sequencing of the switch circuit and provides a stable second power rail voltage to transfer logic signals with little or no distortion. In various embodiments, the switch 111 includes a diode. In some embodiments, the diode can be a schottky diode.

Figure 2:
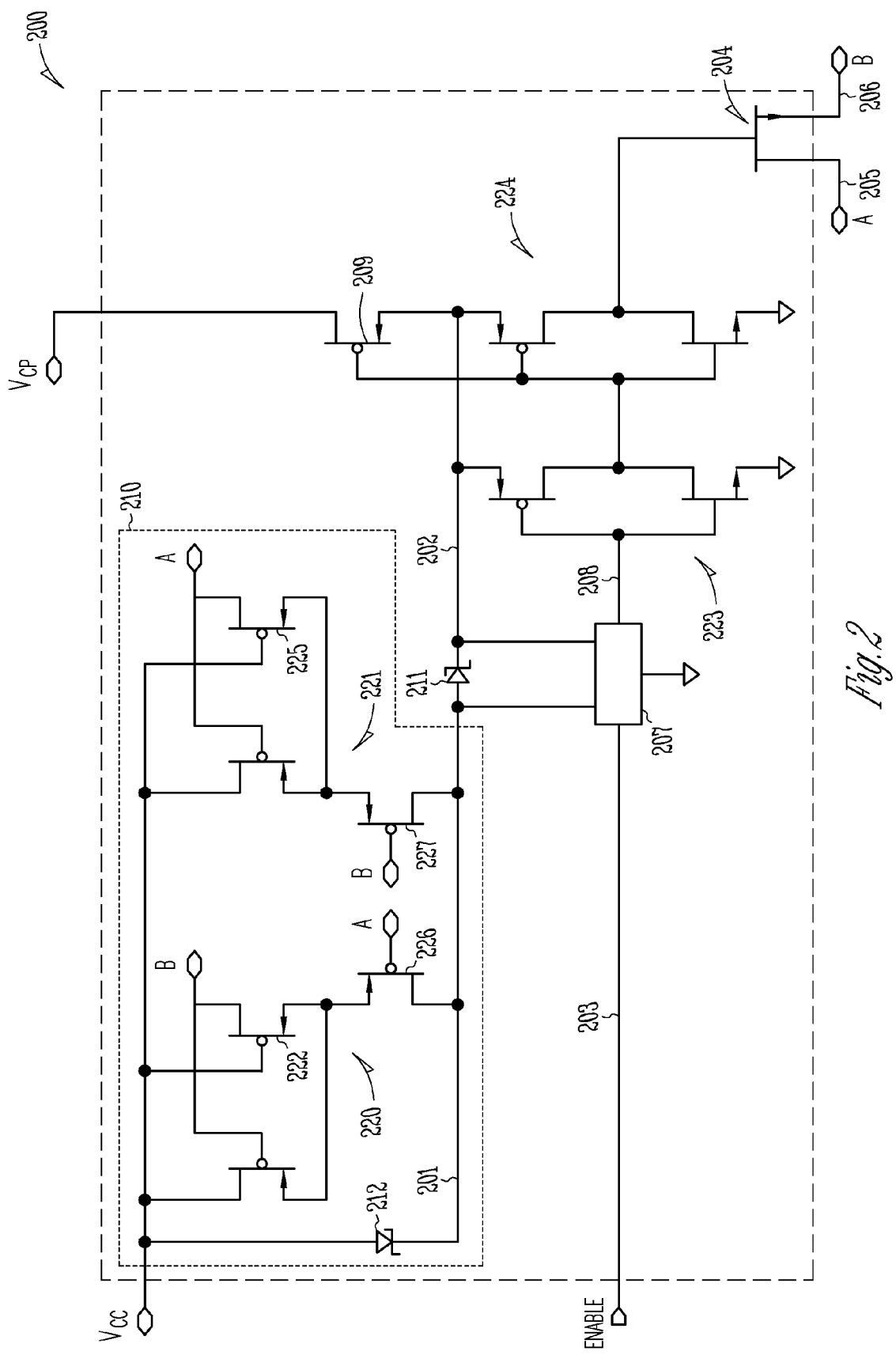
FIG. 2 is a detailed schematic of a switch circuit according to one embodiment of the present subject matter.

FIG. 2 is a detailed schematic of a switch circuit according to one embodiment of the present subject matter. The switch circuit 200 includes a first power rail 201 (or first supply node), a second power rail 202 (or second supply node), an enable input 203 and a switch 204 to controllably isolate and controllably transfer logic signals between a first node A 205 and a second node B 206. The first power rail 201 is coupled to a first power supply Vcc through a power down protection circuit 210. The power down protection circuit 210 includes a pair of arbiter circuits 220, 221 coupled to nodes A and B and the first power supply. Each arbiter circuit 220, 221 include a pair of cross coupled transistors and a third transistor cross coupled to an input of the other arbiter circuit. The protection circuit 210 limits current leakage from the switched nodes when a high logic signal is present on one or more of the switched nodes and the switch is disabled, such as when the power supply to the circuit is off. Limiting the leakage current at these times conserves energy such as energy from a limited supply source such as a battery or high capacity capacitor. Such limited power sources can be used to power the device incorporating the switch circuit or a device connected to the switch circuit through one or more nodes of the switch 204. For example, when the power supply of the circuit is off, the protection circuit limits current leakage by raising the first power rail to a high logic level when a high logic level voltage is present on one of the nodes of the switch. For example, if Vcc=0, node B is at low logic level voltage, and a high logic level voltage is present on node A, transistors 225 and 227 will turn on raising the first power rail to about the logic level of node A. If the logic high voltage is present on node B, transistors 222 and 226 turn on to pull the first power rail to about the logic level of node B. The logic high level on the first power rail 201 powers the switch circuit 200, including the second power rail 202 through the rectifier 211, to definitively couple the gate of the switch 204 to ground. With the gate of the switch 204 coupled to ground, strong isolation is maintained between the switched nodes A and B, 205, 206 of the switch 204. If high logic voltage levels are present on both nodes A and B, the third transistor 226, 227 in each of the arbiter circuits 220, 221 isolates nodes A and B from each other with the higher of the voltages on nodes A and B powering the switch circuit 200.

The rectifier 211 of the switch circuit works with the power down protection circuit 210 to pull up the second power rail 202 to about the logic level of the first power rail 201 when Vcp is turned off or is at a significantly lower voltage than the voltage of the first power rail 201. The rectifier 211 also works to supply charge to the second power rail 202 upon power up of the circuit 200. In various embodiments, the second power rail 202 is coupled to a second power supply Vcp, such as a charge pump, that can take some interval of time to reach a steady state operating level. During power up, the switch 204 can demand charge as logic signals are transferred through the switch 204. The first power supply Vcc, in various embodiments, is at its steady state level upon power up of the switch circuit 200. Such a power supply can include, but is not limited to, a battery. The rectifier 211 pulls the voltage of the second power rail 202 to substantially that of the first power rail 201 during power up allowing logic signals to be passed by the switch 204 with little if any distortion. In addition to assisting with power down protection and power up functionality, the rectifier 211 also allows the second power supply Vcp to be coupled to the second power rail with a single pull-up transistor 209, such that in steady state operation, the second power rail 202 is only about one threshold voltage level below the output voltage of the second power supply Vcp. The single pull-up transistor 209 pulls the second power rail up closer to the second supply voltage than switch circuits employing multiple transistors to couple the second supply to a second power rail. This reduces the need for higher voltage second supplies. In combination with the rectifier 211, the single pull-up transistor 209 reduces the need for higher power second power supplies, such as higher-powered charge pumps. Higher powered and bulkier supplies are needed in circuits employing multiple transistors to overcome the multiple threshold voltages of the transistors used to couple the second supply to the second power rail to match the power up performance of a circuit according to the present subject matter. Circuits with higher-powered supplies are more expensive and require more chip surface than a circuit according to the present subject matter.

In various embodiments, a switching circuit 200 includes a level shifting circuit 207. In such circuits, the second power supply can be a charge pump with a voltage output Vcp substantially higher that the voltage output Vcc of the first power supply. An input, such as an enable input 203, can be referenced to the first power supply and be used to switch an output 208 referenced to the second power supply. The level shifting circuit 207 avoids the situation where a PMOS transistor may have a lower high logic gate voltage than a source voltage. If a high logic voltage at the gate of a PMOS transistor is greater than a threshold below the source voltage, the PMOS transistor will conduct unwanted supply current, "crowbar current". Without a level shifting circuit, "crow bar" current can cause unexpected operation of the switch circuit without reference to the enable input 203.

In FIG. 2, the output of the level shifting circuit 207 simultaneously controls the switch 204 and the coupling of the second power supply Vcp to the second power rail 202 using pull-up transistor 209. In various embodiments, the output 208 is buffered once 223 to control the coupling of the second power supply Vcp to the second power rail 202 and buffered a second time 224 to control the switch 204. In various embodiments, the single pull-up transistor 209 is a PMOS transistor and the switch 204 is a NMOS transistor. It is understood that other transistor configurations are possible without departing from the scope of the present subject matter including, but not limited to, NMOS pull-up transistors, PMOS switches and combinations thereof. In addition, MOS devices in this context are not restricted literally to metal-oxide-semiconductor devices having a metal gate, but can also include both polysilicon and metal gate devices as well.

In some embodiments, a circuit 200 according to the present subject matter with an NMOS switch 204 can include or be employed with a parallel PMOS switch. In such embodiments, the protection circuit 210 can decouple the first power supply Vcc from the first power rail 201 when nearly equal high logic level voltages exist on both the A and B nodes 205, 206, such as when transferring a high logic signal. In such cases, the first power rail 201 can begin to droop. Such droop can cause PMOS devices to leak and unexpected operation can result. Thus, the protection circuit 210 can optionally include a diode 212 to assure the first power rail 201 stays within a threshold voltage of the supply voltage Vcc.

Figure 3:
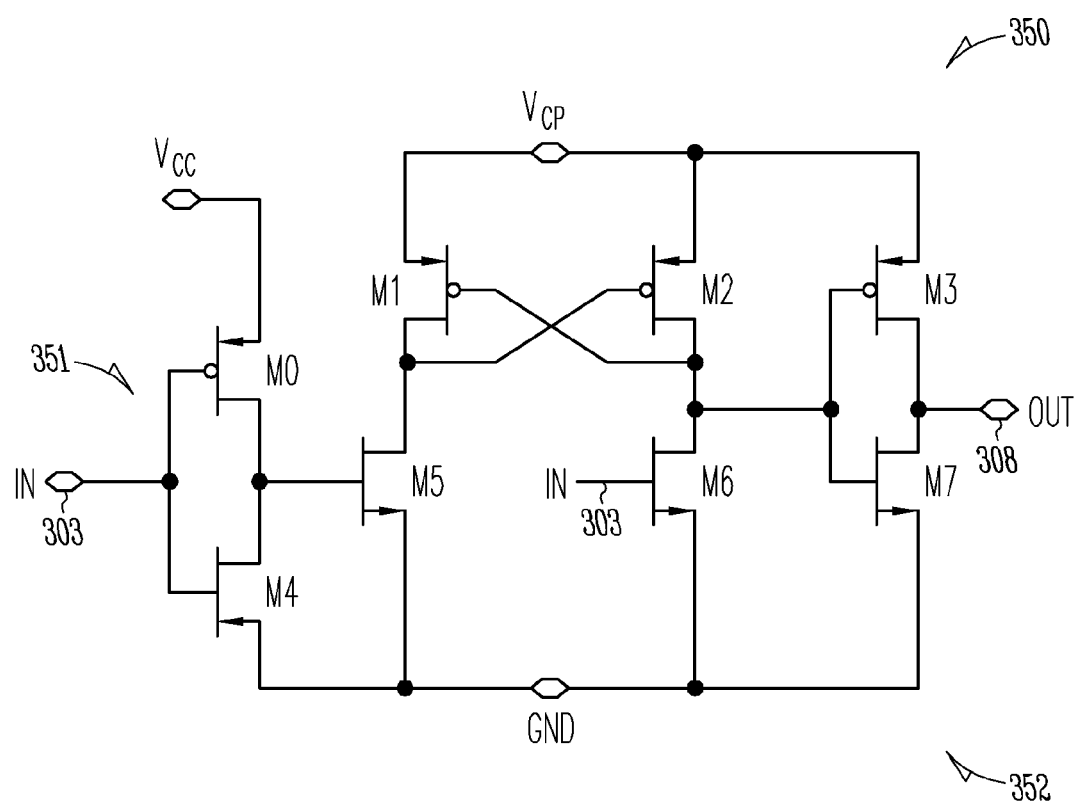
FIG. 3 shows a level shifting circuit according to one embodiment of the present subject matter.

FIG. 3 shows a level shifting circuit 350 according to one embodiment of the present subject matter. The circuit includes an input section 351 referenced to Vcc and an output section 352 referenced to Vcp. When the enable input 303 is at logic high with reference to Vcc, NMOS transistor M6 turns on. The drain of M6 is pulled to GND. M3 is turned on and the output 308 is pulled to high logic referenced to Vcp. Note that turning on M6 also turns on M1, preventing M2 from biasing the source of M6. When the input is referenced to low logic, GND, PMOS transistor M0 of inverter pair M0/M4 turns on. The inverter turns on M5 pulling the gate of M2 low thus turning on M2. M2 pulls the gate of M7 of the output inverter M3/M7 high, thus pulling the output 308 to a logic low level.

Figure 4A:
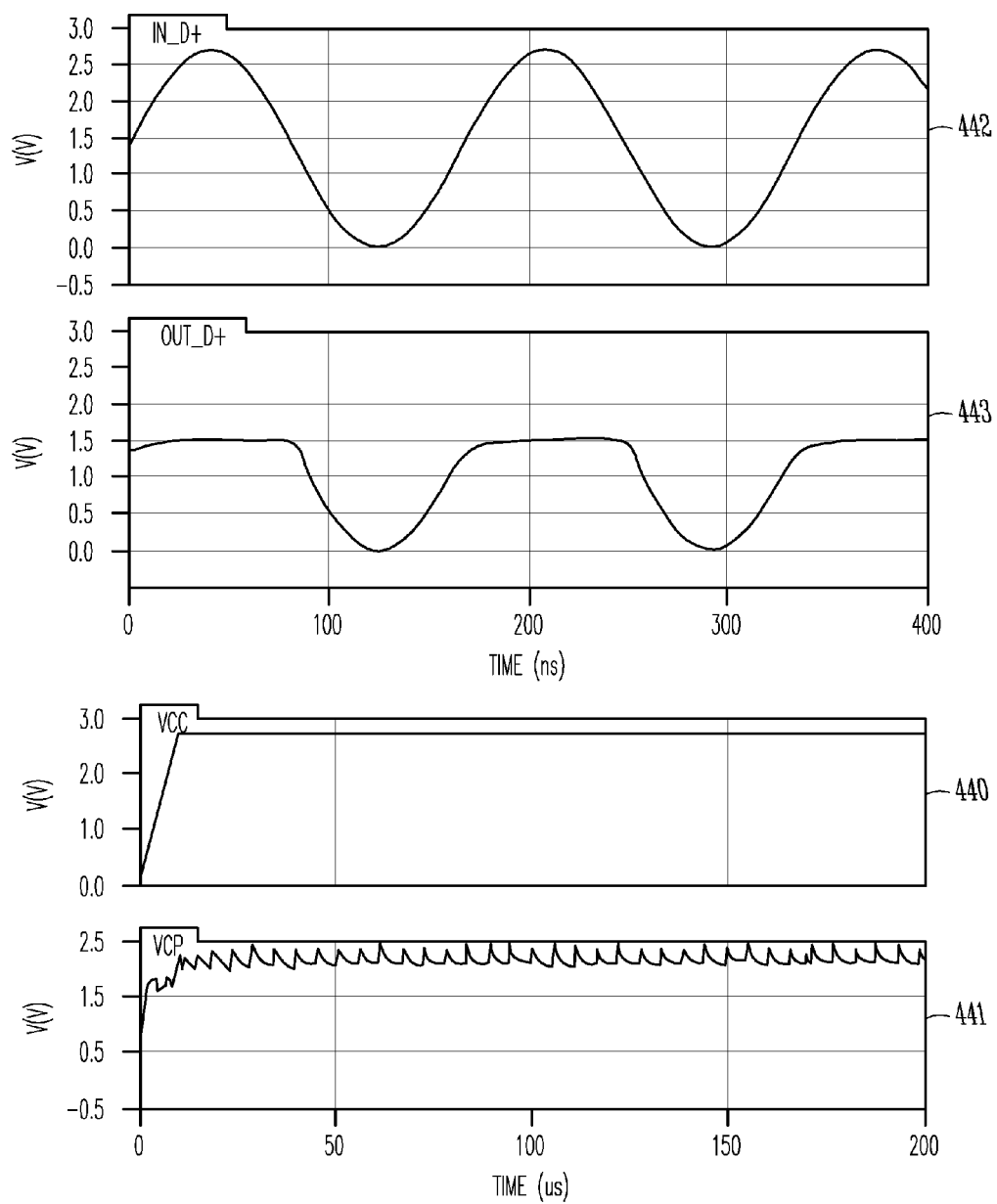
FIGS. 4A and 4B show power up waveforms of a switch circuit employing multiple transistors to couple a power supply and the supply node used to control the switch and a switch circuit according to the present subject.
Figure 4B:
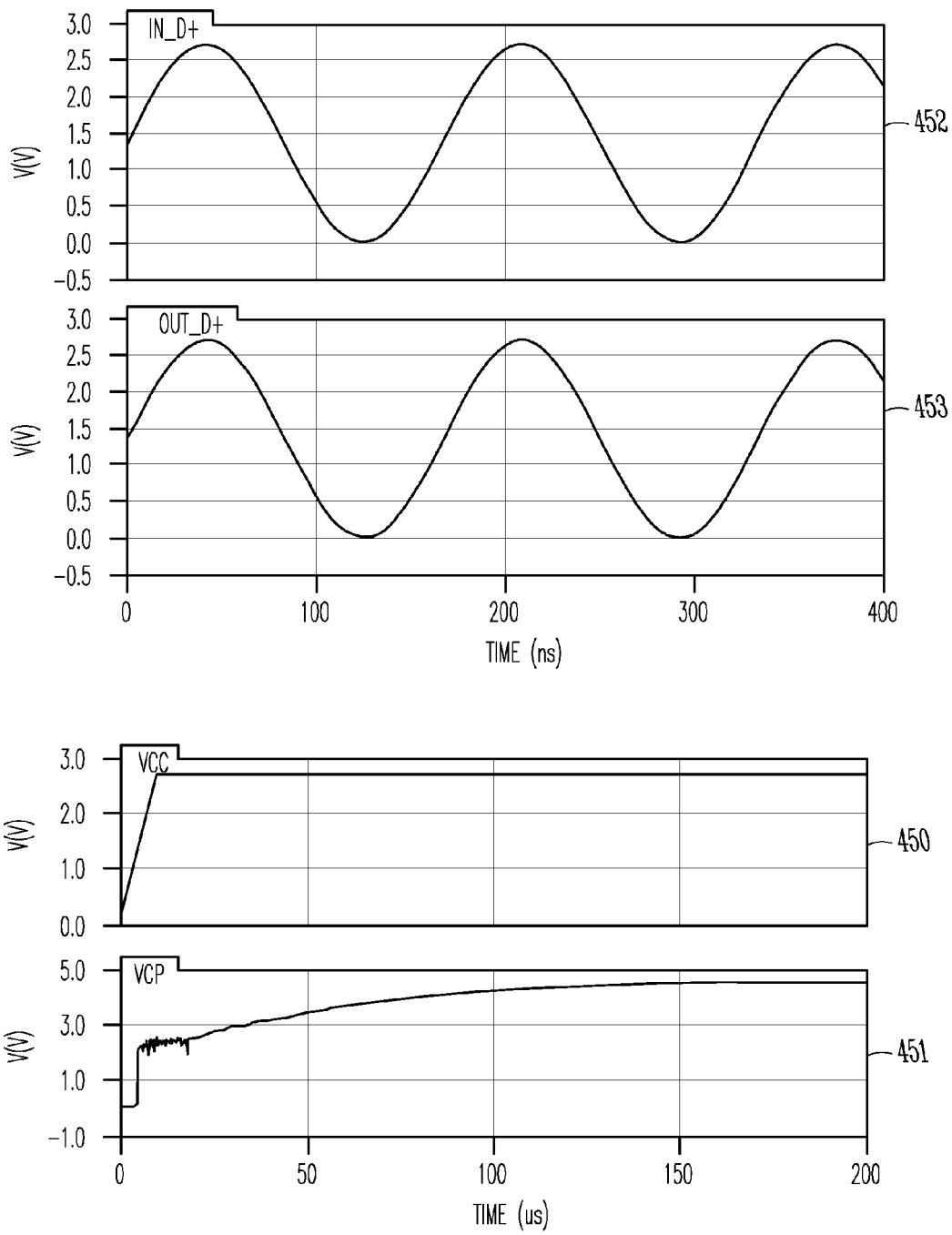

FIGS. 4A and 4B show power up waveforms of a switch circuit employing multiple transistors to couple a power supply and the power rail used to control the switch and a switch circuit according to the present subject. FIG. 4A shows first power rail voltage 440, a second power rail voltage 441, an input waveform at the switch 442 and an output waveform 443 at the switch, all during power up of a switch circuit employing multiple transistors to couple a power supply to the second power rail controlling the transfer switch. Note the distortion of the transferred signal compared to the input signal. Also note the inability of the second power rail to reach a sufficient logic level when the switch demands charge throughout the power up of the circuit as well as beyond the time the second power rail reaches a steady voltage level.

FIG. 4B shows first power rail voltage 450, a second power rail voltage 451, an input waveform at the switch 452 and an output waveform at the switch 453, all during power up of a switch circuit according to one embodiment of the present subject matter. Note that the transferred signal is comparable to the input signal with little if any perceptible distortion.

Thus, the circuit is able to transfer a logic signal robustly from the moment of power up without power up sequencing as may be required in other switch circuits.

Figure 5:
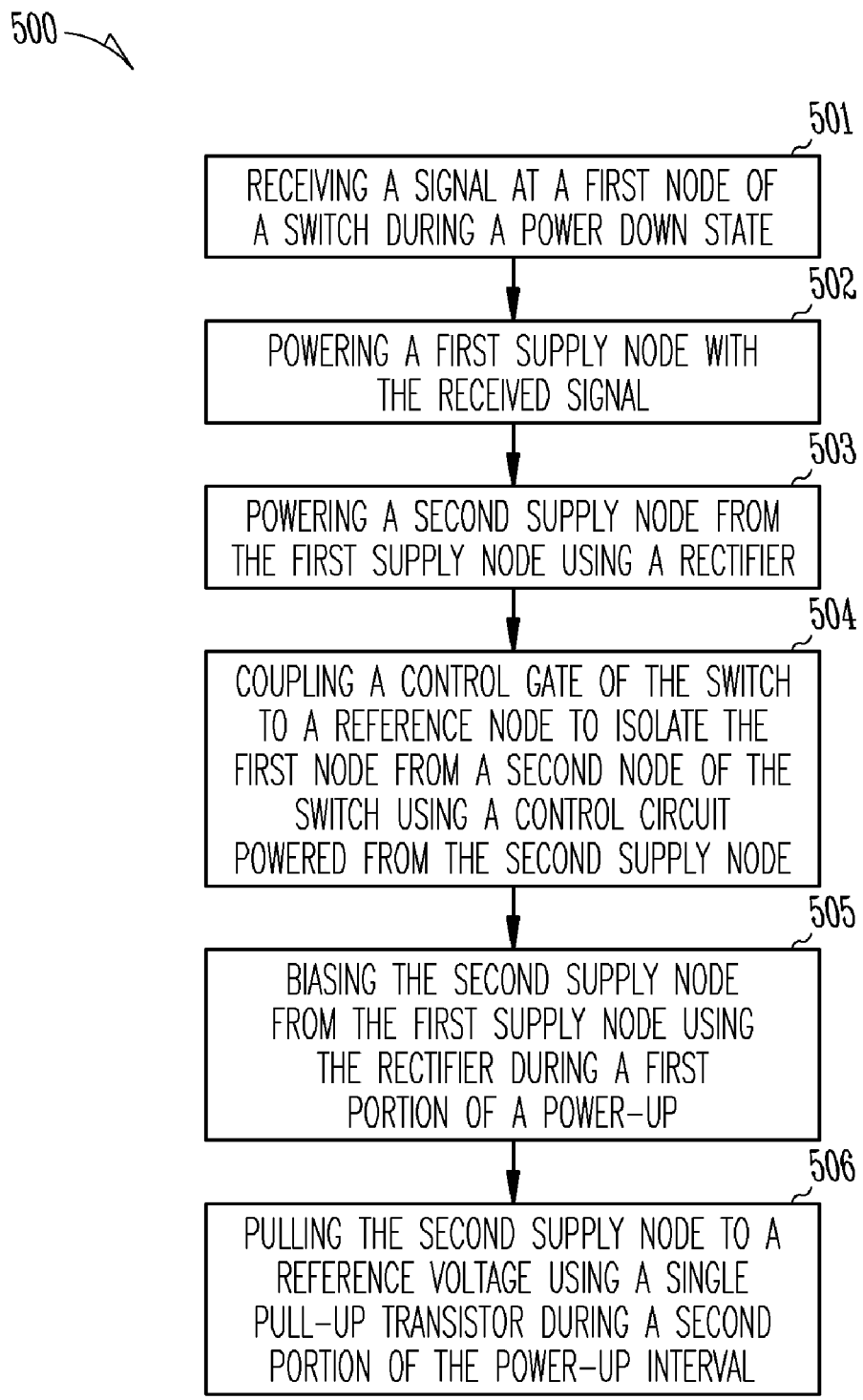
FIG. 5 is a flowchart of a method for operating a switch circuit according to one embodiment of the present subject matter.

FIG. 5 is a flowchart of a method for operating a switch circuit according to one embodiment of the present subject matter. The method 500 includes receiving a signal on a first node of a switch when the switch circuit is in a powered-down state at step 501, powering a first power rail with the received signal using a power down protection circuit at step 502, powering a second power rail using a rectifier at step 503, and coupling a gate of the switch to a reference node to isolate the first node from a second node of the switch using a control circuit powered from the second power rail at step 504. The method can also include biasing the second power rail from the first power rail using the rectifier during a first portion of a power up interval at step 505, and pulling the second power rail to a reference voltage using a single pull-up transistor during a second portion of the power up interval at step 506. In various embodiments, a power down state includes a state when a first power supply couple to the first power rail and a second power supply coupled to the second power rail are powered-down and the voltage from the supplies at the switch circuit is at or near 0 volts. In various embodiments, the power up interval includes the time at which the first and second power supplies are electrically coupled to the circuit and/or beginning to supply voltage to the circuit and the time shortly thereafter.

Additional Notes

The above detailed description includes references to the accompanying drawings, which form a part of the detailed description. The drawings show, by way of illustration, specific examples in which the invention can be practiced. These examples are also referred to herein as "examples." Such examples can include elements in addition to those shown or described. However, the present inventor also contemplates examples in which only those elements shown or described are provided. Moreover, the present inventor also contemplates examples using any combination or permutation of those elements shown or described (or one or more aspects thereof), either with respect to a particular example (or one or more aspects thereof), or with respect to other examples (or one or more aspects thereof) shown or described herein.

All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first,"

"second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other examples can be used, such as by one of ordinary skill in the art upon reviewing the above description. The Abstract is provided to comply with 37 C.F.R. §1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed example. Thus, the following claims are hereby incorporated into the Detailed Description, with each claim standing on its own as a separate example. The scope of the invention should be determined with reference to the appended claims, along with the full scope of legal equivalents to which such claims are entitled.

What is claimed is:

1. A circuit comprising:
a first supply node coupled to a first input of a level shifting circuit via a protection circuit;
a second supply node coupled to a second input of the level shifting circuit via a single pull-up transistor;
a switch including a control input, a first node, and a second node controllably isolated from the first node, wherein the control input is coupled to the level shifting circuit;
wherein the first supply node and the second supply node are coupled via a rectifier; and
wherein the protection circuit is configured to use a logic level of one of the first or second nodes to power the first and second supply nodes and to controllably isolate the first and second nodes from each other when a voltage of one of the first or second nodes exceed a threshold voltage.

2. The circuit of claim 1, wherein the protection circuit includes at least two transistors; and
wherein a gate input of a first transistor in the protection circuit is connected to a source input of a second transistor.

3. The circuit of claim 1, including a buffer circuit configured to couple the control node of the switch to an output of the level shifting circuit.

4. The circuit of claim 3, wherein the buffer circuit includes a complementary pair of field effect transistors.

5. The circuit of claim 1, wherein the second supply node is configured to receive a regulated voltage provided at least in part using a charge pump circuit.

6. The circuit of claim 5, wherein the regulated voltage of the second supply node is greater than the voltage of the first supply node during steady-state operation of the circuit.

7. The circuit of claim 5, wherein, during a power-on state, the second supply node is initially biased by the first supply node when an instantaneous voltage of the second node is below an instantaneous voltage of the first node by a specified voltage margin.

8. The circuit of claim 1, wherein the threshold includes a specified threshold.

9. The circuit of claim 1, wherein the rectifier includes a schottky diode.

10. The circuit of claim 1, wherein the protection circuit, the switch, the rectifier, and the level shifting circuit are included in an integrated circuit device.

11. The circuit of claim 1, wherein the single pull-up transistor includes a PMOS field effect transistor.

12. The circuit of claim 1, wherein the level shifting circuit is configured to provide a logic output signal from a level shift output in response to a logic input signal provided to an third input of the level shifter, the logic output signal referenced to the second supply node, and the logic input signal referenced to the first supply node.

13. A circuit comprising:
a level shifting circuit including a first input configured to be coupled to a first supply using a protection circuit and a second input configured to be coupled to a second supply using a single pull-up transistor, wherein the first input is coupled to the second input using a diode;
a switch including a control input, a first node, and a second node controllably isolated from the first node, wherein the control input is coupled to the level shifting circuit; and
wherein the protection circuit is configured to use a logic level of one of the first or second nodes to power the first and second supply nodes and to controllably isolate the first and second nodes from each other when a voltage of one of the first or second nodes exceed a threshold voltage.

14. The circuit of claim 13, wherein the protection circuit includes at least two transistors; and
wherein a gate input of a first transistor in the protection circuit is connected to a source input of a second transistor.

15. The circuit of claim 13, including a buffer circuit configured to couple the control node of the switch to a level shift output of the level shifting circuit.

16. The circuit of claim 15, wherein the buffer circuit includes a complementary pair of field effect transistors.

17. The circuit of claim 13, wherein the second supply node is configured to receive a regulated voltage provided at least in part using a charge pump circuit.

18. The circuit of claim 17, wherein the regulated voltage of the second supply node is greater than the voltage of the first supply node during steady-state operation of the circuit.

19. The circuit of claim 17, wherein, during a power-on state, the second supply node is initially biased by the first supply node when an instantaneous voltage of the second node is below an instantaneous voltage of the first node by a specified voltage margin.

20. The circuit of claim 13, wherein the rectifier includes a schottky diode.

21. The circuit of claim 13, wherein the protection circuit, the switch, the rectifier, and the level shifting circuit are included in an integrated circuit device.

22. The circuit of claim 13, wherein the single pull-up transistor includes a PMOS field effect transistor.

23. The circuit of claim 13, wherein the level shifting circuit is configured to provide a logic output signal from a level shift output in response to a logic input signal provided to a third input of the level shifter, the logic output signal referenced to the second supply node, and the logic input signal referenced to the first supply node.

24. A method comprising:
powering a first supply node of a switch circuit during a power down state with a voltage present at one of a first switch node or a second switched node of the switch circuit using a power down protection circuit of the switch circuit;
powering a second supply node of the switched circuit during the power down state from the first supply node using a rectifier;
coupling a gate node of the switch circuit to ground to isolate the first switched node and the second switch node of the switch from each other, wherein the gate node of the switch circuit is coupled to a buffer circuit powered using the second supply node, and
wherein a first supply input voltage and a second supply input voltage of the switch circuit equal about zero volts during the power down state.

25. The method of claim 24, further including powering the second supply node from the first supply node during a portion of a power-on state of the switch circuit using the rectifier, wherein the first supply input voltage is a threshold higher than the second supply input voltage during the portion of the power-on state.

* * * * *